United States Patent
Zhang

(10) Patent No.: US 12,295,221 B2
(45) Date of Patent: May 6, 2025

(54) DISPLAY PANEL AND DISPLAY DEVICE HAVING AN ADHESIVE LAYER BETWEEN AN ORGANIC LAYER AND AN INORGANIC LAYER TO ENHANCE THE BONDING FORCE OF AN INTERFACE

(71) Applicant: WUHAN CHINA STAR OPTOELECTRONICS SEMICONDUCTOR DISPLAY TECHNOLOGY CO., LTD., Wuhan (CN)

(72) Inventor: Yunti Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 804 days.

(21) Appl. No.: 17/296,216

(22) PCT Filed: Mar. 26, 2021

(86) PCT No.: PCT/CN2021/083313
§ 371 (c)(1),
(2) Date: May 21, 2021

(87) PCT Pub. No.: WO2022/193353
PCT Pub. Date: Sep. 22, 2022

(65) Prior Publication Data
US 2023/0060896 A1    Mar. 2, 2023

(30) Foreign Application Priority Data
Mar. 15, 2021    (CN) .......................... 202110273994.4

(51) Int. Cl.
*H10K 59/131*    (2023.01)
*G06F 3/041*    (2006.01)
(Continued)

(52) U.S. Cl.
CPC ......... *H10K 59/131* (2023.02); *G06F 3/0412* (2013.01); *G06F 3/04164* (2019.05);
(Continued)

(58) Field of Classification Search
None
See application file for complete search history.

(56) References Cited

U.S. PATENT DOCUMENTS 5,703,408 A * 12/1997 Ming-Tsung ........... H01L 24/03
257/784
6,485,815 B1 * 11/2002 Jeong .................. H01L 23/5226
428/210
(Continued)

FOREIGN PATENT DOCUMENTS

CN    106935633 A    7/2017
CN    107302014 A    10/2017
(Continued)

OTHER PUBLICATIONS

Chinese Office Action issued in corresponding Chinese Patent Application No. 202110273994.4 dated Apr. 29, 2022, pp. 1-7.
(Continued)

*Primary Examiner* — Joseph C. Nicely
*Assistant Examiner* — E. Rhett Cheek
(74) *Attorney, Agent, or Firm* — PV IP PC; Wei Te Chung

(57) ABSTRACT

A display panel and a display device are provided. An adhesive layer is disposed between an organic layer and an inorganic layer in a bonding area of the display panel, where a surface roughness of an adhesive layer material is greater
(Continued)

than a surface roughness of an organic layer material and a surface roughness of an inorganic layer material. In addition, a plurality of concave-convex structures can be provided on a surface of the organic layer and/or a surface of the inorganic layer in contact with the adhesive layer to enhance interface bonding force. This can alleviate a problem that film layers are prone to peeling off when a flexible printed circuit (FPC) is bonded to the display panel in the prior art.

16 Claims, 6 Drawing Sheets

(51) Int. Cl.
*H10K 59/40* (2023.01)
*H10K 71/00* (2023.01)
*G06F 3/044* (2006.01)
*H10K 59/12* (2023.01)

(52) U.S. Cl.
CPC ............ *H10K 59/40* (2023.02); *H10K 71/00* (2023.02); *G06F 3/0443* (2019.05); *G06F 2203/04103* (2013.01); *H10K 59/1201* (2023.02)

(56) References Cited

U.S. PATENT DOCUMENTS

| 10,347,862 | B2 | 7/2019 | Sonoda et al. |
| 2012/0256201 | A1* | 10/2012 | Lee .................. H10K 50/8445 |
| | | | 257/E33.059 |
| 2018/0108717 | A1* | 4/2018 | Seol ..................... H10K 59/12 |
| 2019/0004653 | A1* | 1/2019 | Won ..................... G06F 3/0443 |
| 2020/0105800 | A1* | 4/2020 | Zhang ..................... H01L 22/34 |
| 2020/0273922 | A1* | 8/2020 | Park ..................... H10K 59/88 |
| 2021/0028241 | A1* | 1/2021 | Kim ..................... H01L 27/124 |

FOREIGN PATENT DOCUMENTS

| CN | 109273507 | A | | 1/2019 |
| CN | 111755463 | A | | 10/2020 |
| CN | 111766969 | A | * | 10/2020 |
| CN | 111987127 | A | | 11/2020 |
| IN | 110473835 | A | | 11/2019 |

OTHER PUBLICATIONS

International Search Report in International application No. PCT/CN2021/083313, mailed on Dec. 17, 2021.
Written Opinion of the International Searching Authority in International application No. PCT/CN2021/083313, mailed on Dec. 17, 2021.

* cited by examiner

DISPLAY PANEL AND DISPLAY DEVICE HAVING AN ADHESIVE LAYER BETWEEN AN ORGANIC LAYER AND AN INORGANIC LAYER TO ENHANCE THE BONDING FORCE OF AN INTERFACE

RELATED APPLICATIONS

This application is a Notional Phase of PCT Patent Application No. PCT/CN2021/083313 having international filing date of Mar. 26, 2021, which claims the benefit of priority of Chinese Patent Application Nos. 202110273994.4 filed on Mar. 15, 2021. The contents of the above applications are all incorporated by reference as if fully set forth herein in their entirety.

FIELD OF INVENTION

This application relates to display technology, and in particular to a display panel and a display device.

BACKGROUND OF INVENTION

Organic light-emitting diode (OLED) display panels have advantages of self-luminescence, high contrast, thin thickness, wide viewing angles, and fast response times. They are representatives of a new generation of flat display technology and increasingly favored by industry. Generally, a bonding area is provided on the display panel, and an external flexible printed circuit (FPC) is bonded to bonding pads on the bonding area to provide an external driving power signal for the display panel. The bonding pads are usually formed by patterning a metal conductive layer in a touch layer and the bonding pads are connected with metal circuits in an array substrate to realize signal conduction between the FPC and the display panel.

The touch layer can adopt direct on-cell touch (DOT) technology (a touch screen is directly embedded into a display screen) to directly produce a metal conductive layer on a surface of an encapsulation layer to form a touch circuit. However, between the metal conductive layer of the bonding area and metal circuits of the array substrate, an inorganic film layer and an organic film layer are in direct contact, for example, an inorganic layer of DOT is in direct contact with an organic layer on the array substrate. A material of the organic layer is generally an organic compound, and a material of the inorganic layer is generally an inorganic compound. Due to differences in characteristics of film interface and interface pollution caused by switching equipment and transportation, when bonding the FPC to the display panel, it is easy to cause poor peeling between the organic layer and the inorganic layer in the bonding area. As a result, the flexible printed circuit will fall off after it is bonded to the bonding pads, thereby greatly reducing the yield of the display panel.

Therefore, in the prior art display panel, a problem that a film layer is prone to peeling when an FPC is bonded needs to be solved.

Technical Problem

The present application provides a display panel and a display device to alleviate a technical problem in the prior art that film layers are likely to peel off when the flexible printed circuit (FPC) is bonded to the display panel.

SUMMARY OF INVENTION

In order to solve the above problem, the technical solutions provided by the present application are as follows:

An embodiment of the present application provides a display panel which includes a display area and a non-display area positioned at one side of the display area. The non-display area includes a bonding area, and the display panel in the bonding area further includes a substrate, a signal line pattern, an insulating protection layer, and a bonding terminal. The signal line pattern is disposed on the substrate. The insulating protection layer is disposed on the signal line pattern, wherein an opening is provided at a position corresponding to the signal line pattern, and the opening exposes at least part of the signal line pattern. The bonding terminal is disposed on the insulating protective layer and is electrically connected to the signal line pattern through the least part of the signal line pattern in the opening. The insulating protection layer includes an adhesive layer, where an organic layer and an inorganic layer disposed on opposite sides of the adhesive layer. A surface roughness of the adhesive layer is greater than a surface roughness of the organic layer and a surface roughness of the inorganic layer.

In the display panel provided by an embodiment of the present application, a surface of the organic layer or the inorganic layer in contact with the adhesive layer is provided with concave-convex structures.

In the display panel provided by an embodiment of the present application, surfaces of the organic layer and the inorganic layer in contact with the adhesive layer are provided with concave-convex structures.

In the display panel provided by the embodiment of the present application, the concave-convex structures of the organic layer and the concave-convex structures of the inorganic layer are alternately arranged.

In the display panel provided by the embodiment of the present application, a cross-sectional shape of the concave-convex structures includes at least one of rectangular, square, triangular, trapezoidal, arc, or a convex-shape.

In the display panel provided by the embodiment of the present application, the organic layer is disposed on a side of the adhesive layer facing the signal line pattern, and the inorganic layer is disposed on a side of the adhesive layer away from the signal line pattern.

In the display panel provided by the embodiment of the present application, a thickness of the adhesive layer is less than a thickness of the organic layer and a thickness of the inorganic layer.

In the display panel provided by the embodiment of the present application, a material of the adhesive layer comprises amorphous silicon.

In the display panel provided by the embodiment of the present application, further including a driving circuit functional layer disposed on the substrate, wherein the driving circuit functional layer includes an active layer, a gate insulating layer, a gate, a first interlayer insulating layer, a first source/drain layer, a second interlayer insulating layer, and a second source/drain layer stacked in the display area.

In the display panel provided by the embodiment of the present application, the signal line pattern includes a first metal pattern provided in a same layer as the gate, a second metal pattern provided in a same layer as the first source/drain layer, and a third metal pattern provided in a same layer as the second source/drain layer, and the first metal pattern, the second metal pattern, and the third metal pattern are in contact with each other.

In the display panel provided by the embodiment of the present application, a cross-sectional shape of the opening of the insulating protection layer includes inverted trapezoidal.

An embodiment of the present application also provides a display device, which includes a display panel and a driving device. The display panel include a display area and a non-display area positioned at one side of the display area, the non-display area is provided with a bonding area, and the display panel in the bonding area includes: a substrate; a signal line pattern disposed on the substrate; an insulating protection layer disposed on the signal line pattern, wherein an opening is provided at a position corresponding to the signal line pattern, and the opening exposes at least part of the signal line pattern; and a bonding terminal disposed on the insulating protective layer and electrically connected to the signal line pattern through the at least part of the signal line pattern in the opening; wherein the insulating protection layer includes an adhesive layer, an organic layer and an inorganic layer disposed on opposite sides of the adhesive layer, and a surface roughness of the adhesive layer is greater than a surface roughness of the organic layer and a surface roughness of the inorganic layer. The driving device includes connecting terminals, and the connecting terminals are electrically connected to the bonding terminals.

In the display device provided by the embodiment of the present application, further includes a conductive adhesive, and the connecting terminal is electrically connected to the bonding terminal through the conductive adhesive.

In the display device provided by the embodiment of the present application, the conductive adhesive includes an anisotropic conductive film.

In the display device provided by the embodiment of the present application, a surface of the organic layer or the inorganic layer in contact with the adhesive layer is provided with concave-convex structures.

In the display device provided by the embodiment of the present application, surfaces of the organic layer and the inorganic layer in contact with the adhesive layer are provided with concave-convex structures.

In the display device provided by the embodiment of the present application, the concave-convex structures of the organic layer and the concave-convex structure of the inorganic layer are alternately arranged.

In the display device provided by the embodiment of the present application, the organic layer is disposed on a side of the adhesive layer facing the signal line pattern, and the inorganic layer is disposed on a side of the adhesive layer away from the signal line pattern.

In the display device provided by the embodiment of the present application, a thickness of the adhesive layer is less than a thickness of the organic layer and a thickness of the inorganic layer.

In the display device provided by the embodiment of the present application, a material of the adhesive layer includes amorphous silicon.

Beneficial Effect

In the display panel and the display device provided by the present application, an adhesive layer is disposed between an organic layer and an inorganic layer, and the adhesive layer is formed of amorphous silicon with relatively large surface roughness to strengthen a bonding force between the organic layer and the inorganic layer. In addition, a plurality of concave-convex structures can be provided on a surface of the organic layer and/or a surface of the inorganic layer in contact with the adhesive layer to increase a contact area of an interface, while preventing mutual slippage between film layers, further enhancing a bonding force of the interface. This solves a peeling-off problem of the organic layer and the inorganic layer in the bonding area, which causes the flexible printed circuit to fall off after it is bonded to the bonding pads. Therefore, the yield of the display panel is greatly improved.

DESCRIPTION OF DRAWINGS

In order to explain embodiments or technical solutions in the prior art more clearly, the following will briefly introduce drawings that need to be used in the description of the embodiments or the prior art. It is obvious that the drawings described below are merely some embodiments of the present invention, other drawings can also be obtained by the person ordinary skilled in the field based on these drawings without doing any creative activity.

DETAILED DESCRIPTION OF PREFERRED EMBODIMENTS

Figure 1:
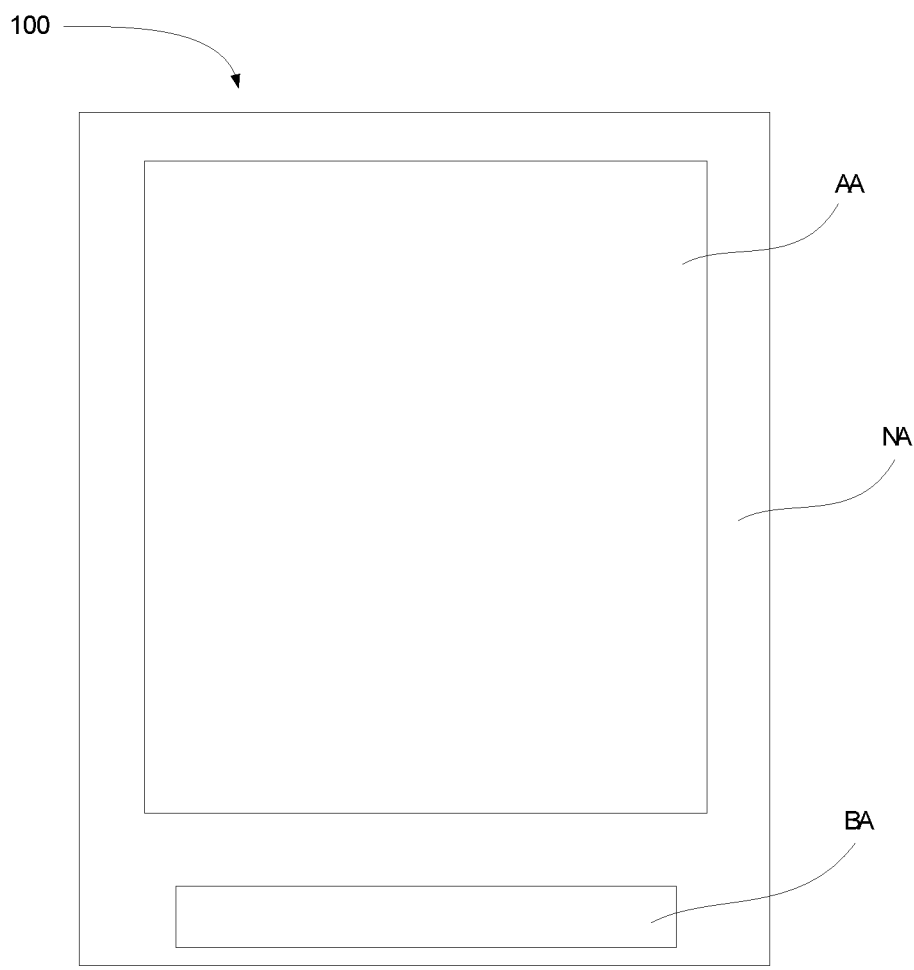
FIG. 1 is a schematic top view structure of a display panel provided by an embodiment of the application.

The description of the following embodiments refers to the attached drawings is to illustrate specific embodiments that can be implemented in the present application. The directional terms mentioned in this application, such as "above", "below", "front", "back", "left", "right", "inner", "outer", "side", etc., are only directions for referring to the attached drawings. Therefore, these directional terms are used to illustrate and understand the application, rather than to limit the application. In the drawings, units with similar structures are indicated by the same reference numerals. In the drawings, for clear understanding and ease of description, the thickness of some layers and areas are exaggerated. That is, the size and thickness of each component shown in the drawings are arbitrarily shown, but the application is not limited thereto.

Figure 2:
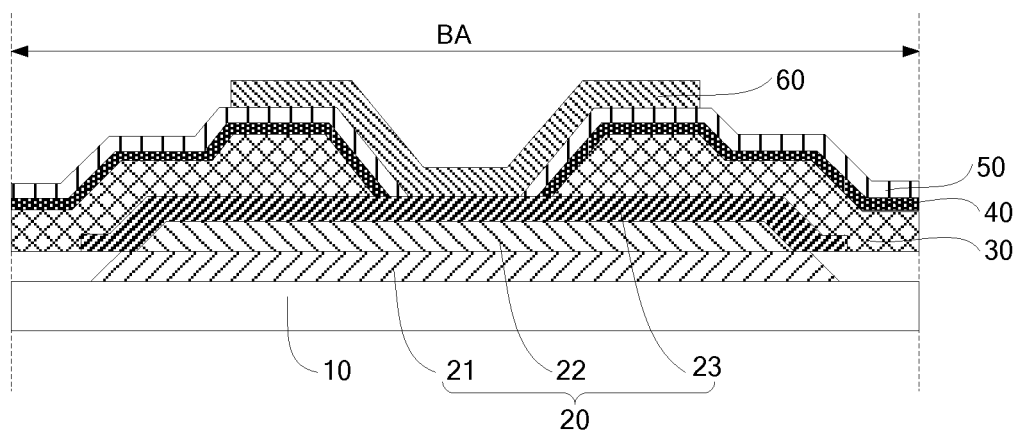
FIG. 2 is a schematic diagram of a first film structure of a bonding area of the display panel provided by an embodiment of the application.

Please refer to FIG. 1 and FIG. 2. FIG. 1 is a schematic diagram of a top view structure of a display panel provided by an embodiment of the application. FIG. 2 is a schematic diagram of a first film structure of a bonding area of the display panel provided by an embodiment of the application. The display panel 100 has a display area AA and a non-display area NA positioned at one side of the display area AA, and a bonding area BA is provided in the non-display area NA. The display panel 100 includes a substrate 10, a signal line pattern 20, an insulating protection layer, and a bonding terminal 60 sequentially stacked on the substrate 10 in the bonding area BA. The signal line pattern 20 is disposed on the substrate 10. The insulating protection layer is disposed on the signal line pattern 20, where an opening is provided at a position corresponding to the signal line pattern 20, and the opening exposes at least part of the signal line pattern 20. The bonding terminal 60 is disposed on the insulating protection layer and is electrically connected to the signal line pattern 20 through a portion in the opening. The insulating protection layer includes an adhesive layer 40 and an organic layer 30 and an inorganic layer 50 disposed on opposite sides of the adhesive layer 40. A surface roughness of the material of the adhesive layer 40 is greater than a surface roughness of the material of the organic layer 30 and a surface roughness of the material of the inorganic layer 50.

Alternatively, the organic layer 30 of the insulating protection layer is disposed on a side of the adhesive layer 40 facing the signal line pattern 20, and the inorganic layer 50 is disposed on a side of the adhesive layer 40 away from the signal line pattern 20. The organic layer 30 is a planarization layer, for example, it can be a planarization layer formed of organic photoresist, etc. The inorganic layer is a passivation layer, for example, a passivation layer formed of silicon nitride ($SiN_x$) or the like. Wherein, the thickness of the adhesive layer 40 is less than the thickness of the organic layer 30 and is less than the thickness of the inorganic layer 50.

Alternatively, a cross-sectional shape of the opening of the insulating protection layer includes inverted trapezoidal, etc., and the opening is formed by the organic layer 30, the adhesive layer 40, and the inorganic layer 50. Specifically, the organic layer 30 is disposed on the signal line pattern 20, and a female opening is provided at a position corresponding to the signal line pattern 20, and the female opening exposes the signal line pattern 20. The adhesive layer 40 is disposed on the organic layer 30 in the female opening but does not cover the signal line pattern 20 at a bottom of the female opening. The inorganic layer 50 is disposed on the adhesive layer 40 and covers the adhesive layer 40 in the female opening to form the opening of the insulating protection layer. The bonding terminal 60 is disposed on the inorganic layer 50 and is electrically connected to the signal line pattern 20 through a portion in the opening. The portion in the opening refers to the portion of the bonding terminal 60 provided in the opening.

The structure and function of each film layer of the display panel will be described in detail below.

Figure 3:
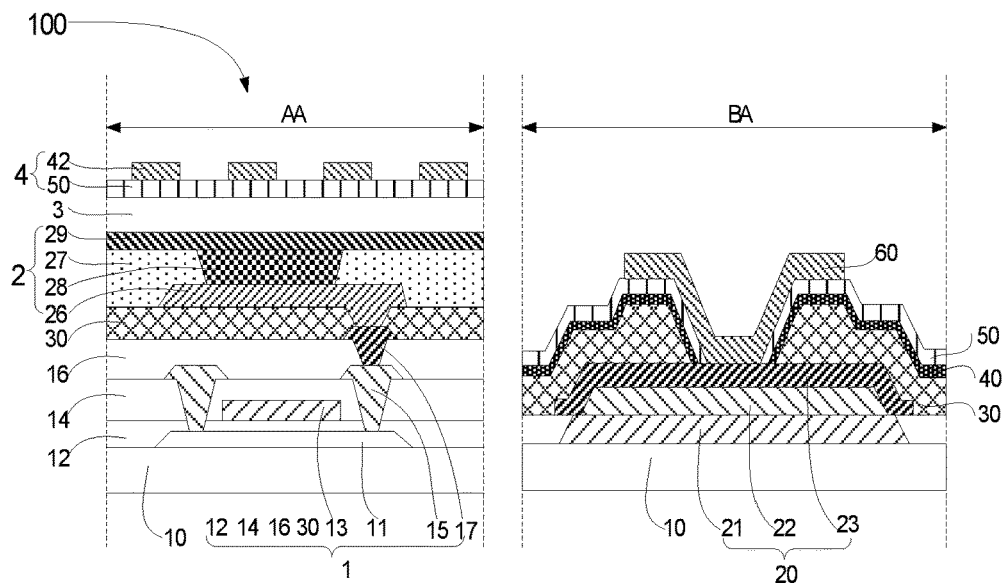
FIG. 3 is a schematic cross-sectional diagram of the display panel provided by an embodiment of the application.

Specifically, please refer to FIG. 3, which is a schematic cross-sectional structure diagram of a display panel provided by an embodiment of the present application. The display panel 100 includes a substrate 10, and a driving circuit functional layer 1, a light-emitting device layer 2, an encapsulation layer 3, and a touch functional layer 4 sequentially disposed on the substrate 10.

The substrate 10 may be a rigid substrate or a flexible substrate. When the substrate 10 is a rigid substrate, it may include a rigid substrate such as a glass substrate. When the substrate 10 is a flexible substrate, it may include a flexible substrate such as a polyimide (PI) film or an ultra-thin glass film.

The driving circuit functional layer 1 is disposed on the substrate 10. Certainly, a buffer layer (not shown) is further disposed between the driving circuit functional layer 1 and the substrate 10. The buffer layer can prevent undesirable impurities or contaminants (such as moisture, oxygen, etc.) from diffusing from the substrate 10 into devices that may be damaged by these impurities or contaminants In addition, it can also provide a flat top surface.

The portion of the driving circuit functional layer 1 positioned in the display area AA includes an active layer 11, a gate insulating layer 12, a gate 13, a first interlayer insulating layer 14, a first source/drain layer 15, a second interlayer insulating layer 16, a second source/drain layer 17, and an organic layer 30 sequentially stacked on the buffer layer 11. The first source/drain layer 15 is connected to the active layer 11 through the via hole of the first interlayer insulating layer 14, and the second source/drain layer 17 is connected to the first source/drain layer 15 through the via hole of the second interlayer insulating layer 16. The material of the organic layer 30 includes organic materials such as organic photoresist.

Please refer to FIG. 2 and FIG. 3. The portion of the driving circuit functional layer 1 positioned in the bonding area BA includes a signal line pattern 20 provided on a buffer layer. The signal line pattern 20 includes a first metal pattern 21 provided on the same layer as the gate electrode 13, a second metal pattern 22 provided in the same layer as the first source/drain layer 15, and a third metal pattern 23 provided in the same layer as the second source/drain layer 17. The first metal pattern 21, the second metal pattern 22, and the third metal pattern 23 are in contact with each other.

The bonding area BA further includes an adhesive layer 40. The adhesive layer 40 is positioned on the surface of the organic layer 30 and in the female opening formed by the organic layer, but the adhesive layer 40 does not cover the signal line pattern 20 exposed at the bottom of the female opening. The material of the adhesive layer 40 includes amorphous silicon, etc. The surface roughness of the amorphous silicon is relatively large, and the adhesive layer 40 covers the surface of the organic layer 30 so that an interfacial bonding force between the organic layer 30 and the adhesive layer 40 is strong. Wherein, the surface roughness of the adhesive layer in this application refers to the characteristics of the material of the adhesive layer itself. For example, the interface state of the amorphous silicon is relatively rough, while the interface state of the organic layer is relatively flat. Therefore, the surface roughness of the adhesive layer is greater than the surface roughness of the organic layer.

It is understandable that in this application, "disposed on the same layer" means that in a manufacturing process, a film layer formed of the same material is patterned to obtain at least two different characteristics. That is, the at least two different characteristics are arranged in the same layer. For example, the second metal pattern 22 and the first source/drain layer 15 of this embodiment are obtained by patterning the same conductive film layer. That is, the second metal pattern 22 and the first source/drain layer 15 are disposed in the same layer.

It should be noted that the film structure of the driving circuit functional layer 1 is not limited to the top gate structure shown in FIG. 3. The film structure of the driving circuit functional layer 1 may also adopt a bottom gate structure or other etch barrier structure. Further, the gate 13 is not limited to a single gate structure shown in FIG. 3, and the gate 13 of the present application may also adopt a double gate structure. Certainly, the source-drain layer is not limited to the two-layer source-drain layer shown in FIG. 3. A single-layer source-drain layer may also be used in other embodiments, which will not be repeated here.

The light-emitting device layer 2 is disposed on the driving circuit functional layer 1, and the light-emitting device layer 2 is not disposed in the bonding area BA. The portion of the light-emitting device layer 2 positioned in the display area AA includes a pixel electrode 26, a pixel definition layer 27, a luminescent material layer 28, and a cathode layer 29. The pixel electrode 26 is connected to the second source/drain layer 17 through a via hole of the organic layer 30. The pixel definition layer 27 is disposed on the pixel electrode 26 and the organic layer 30, and the pixel definition layer 27 is patterned to form pixel openings. The pixel opening exposes a part of the pixel electrode 26 to define an area where the luminescent material is arranged. The luminescent material layer 28 is formed of luminescent material printed in the pixel opening of the pixel definition layer 27. The cathode layer 29 covers the luminescent material layer 28 and the pixel definition layer 27. The luminescent material layer 28 emits light under a cooperative action of the pixel electrode 26 and the cathode layer 29, thereby realizing pixel display of the display panel 100.

The pixel electrode 26 may be a transparent electrode or a reflective electrode. If the pixel electrode 26 is a transparent electrode, the pixel electrode 26 may be formed of, for example, indium tin oxide (ITO), indium zinc oxide (IZO), ZnO, or $In_2O_3$. If the pixel electrode 26 is a reflective electrode, the pixel electrode 26 may include, for example, a reflective layer formed of Ag, Mg, Al, Pt, Pd, Au, Ni, Nd, Ir, Cr, or a combination thereof and a layer formed of ITO, IZO, ZnO, or $In_2O_3$. However, the pixel electrode 26 is not limited thereto, and the pixel electrode 26 may be formed of various materials, and may also be formed in a single-layer structure or a multi-layer structure.

The cathode layer 29 is formed of a transparent conductive material to increase the light transmittance of the luminescent material layer 28. For example, the cathode layer 29 may be formed of a metal with low work function, such as Li, Ca, LiF/Ca, LiF/Al, Al, Ag, Mg, or a combination thereof, or a transparent conductive layer formed of ITO, IZO, ZnO or $In_2O_3$. When the pixel electrode 26 is a reflective electrode, the light utilization efficiency of the luminescent material layer 28 can be further improved.

Certainly, the light-emitting device layer 2 may also include a hole injection layer (HIL) and a hole transport layer (HTL) disposed between the luminescent material layer 28 and the pixel electrode 26, and include an electron injection layer (EIL) and an electron transport layer (ETL) disposed between the luminescent material layer 28 and the cathode layer 29.

The encapsulation layer 3 is disposed on the light-emitting device layer 2, and the encapsulation layer 3 can be encapsulated by a thin film. The thin film encapsulation may be a laminated structure formed by sequentially stacking three layers of films of a first inorganic encapsulation layer, an organic encapsulation layer, and a second inorganic encapsulation layer, or a laminated structure of more layers. It is used to protect the luminescent material layer 28 of the light-emitting device layer 2 to prevent water and oxygen intrusion from causing the luminescent material layer 28 to fail.

The touch functional layer 4 is disposed on the encapsulation layer 3 and adopts a DOT touch solution to realize a touch function. The portion of the touch functional layer 4 positioned in the display area AA includes an inorganic layer 50 disposed on the encapsulation layer 3 and a touch electrode 42 disposed on the inorganic layer 50. The touch electrodes 42 may include a driving electrode and a sensing electrode and adopt a mutual capacitive touch control solution, where the driving electrode and the sensing electrode can be arranged in the same layer or arranged in different layers. Certainly, the present application is not limited to this, and the touch electrode 42 of the present application may also adopt self-capacitive touch.

The portion of the touch functional layer 4 positioned in the bonding area BA includes an inorganic layer 50 disposed on the adhesive layer 40 and a bonding terminal 60 disposed on the inorganic layer 50, where the bonding terminal 60 and the touch electrode 42 are disposed in the same layer. The inorganic layer 50 covers the surface of the adhesive layer 40 but does not cover the signal line pattern 20 exposed at the bottom of the female opening. The material of the inorganic layer 50 includes inorganic materials such as silicon oxide and silicon nitride. The material of the adhesive layer 40 includes amorphous silicon. The interface state of the amorphous silicon is relatively rough, and the interface state of the inorganic layer is relatively flat. Therefore, the surface roughness of the adhesive layer 40 is greater than the surface roughness of the inorganic layer 50. Covering the inorganic layer 50 on the surface of the adhesive layer 40 strengthens the interface bonding force between the inorganic layer 50 and the adhesive layer 40. Therefore, the binding force between the organic layer 30 and the inorganic layer 50 in the bonding area BA is improved. The bonding terminal 60 is disposed on the surface of the inorganic layer 50 and in the opening of the insulating protection layer so that the bonding terminal 60 is electrically connected to the signal line pattern 20 exposed by the opening.

It should be noted that the bonding area BA includes a plurality of bonding terminals 60, and the bonding terminals 60 are electrically connected to the signal line pattern 20. It can input various signals to the display panel 100, and each bonding terminal 60 can input a signal, such as a gate scan signal, a data signal, etc., to the display panel.

In the display panel 100 of this embodiment, an adhesive layer 40 is provided between the organic layer 30 and the inorganic layer 50, wherein the surface roughness of the adhesive layer 40 is greater than the surface roughness of the organic layer 30 and the inorganic layer 50. In this way, the bonding force between the organic layer 30 and the inorganic layer 50 is enhanced, so the problem of peeling of the organic layer 30 and the inorganic layer 50 in the bonding area BA is solved, thereby greatly improving the yield of the display panel 100.

Figure 4:
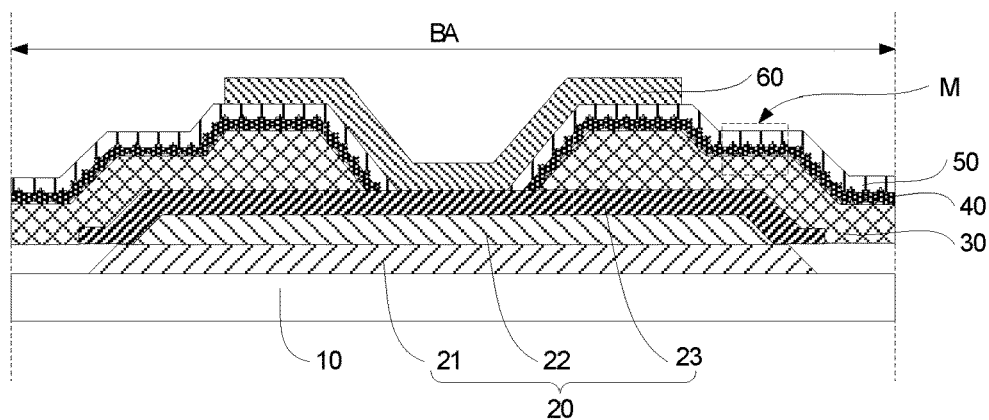
FIG. 4 is a schematic diagram of a second film structure of the bonding area provided by an embodiment of the application.
Figure 5:
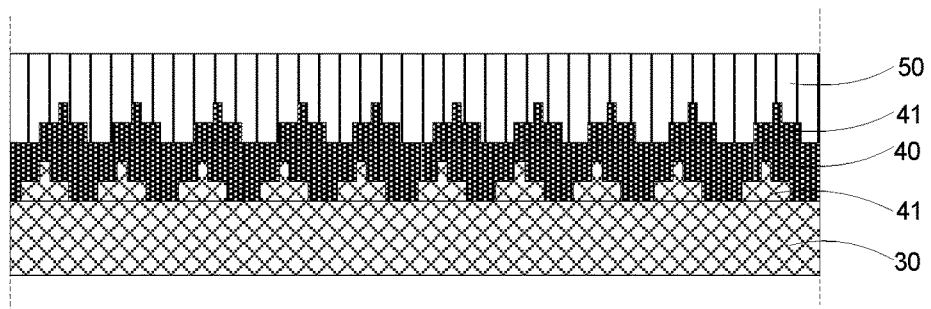
FIG. 5 is an enlarged schematic diagram of M in FIG. 4.

Please refer to FIG. 4 and FIG. 5 together. FIG. 4 is a schematic diagram of a second film structure of the bonding area provided by an embodiment of the application, and FIG. 5 is an enlarged schematic diagram of M in FIG. 4. The difference between the film structure of the bonding area in this embodiment and the film structure of the bonding area in FIG. 2 is that the surface of the organic layer 30 and the inorganic layer 50 in contact with the adhesive layer 40 is provided with concave-convex structures 41. It is understandable that the adhesive layer 40 covers the organic layer 30, and because the surface of the organic layer 30 is provided with a concave-convex structure 41, the surface of the adhesive layer 40 in contact with the organic layer 30 also has an undulating concave-convex shape. Similarly, the inorganic layer 50 covers the adhesive layer 40, and because the surface of the adhesive layer 40 in contact with the inorganic layer 50 is provided with the concave-convex structure 41, the surface of the inorganic layer 50 in contact with the adhesive layer 40 also has an undulating concave-convex shape. Furthermore, among the two film layers in contact with each other, the convex structure in the concave-convex structure provided on the surface of one film layer (for example, the organic layer 30) corresponds to the concave structure in the concave-convex structure of the other film layer (for example, the adhesive layer 40).

In addition, the concave-convex structure 41 of the organic layer 30 and the concave-convex structure 41 of the inorganic layer 50 are alternately arranged. As shown in FIG. 5, the convex structures in the concave-convex structure 41 of the organic layer 30 and the convex structures in the concave-convex structure of the inorganic layer 50 are alternately arranged. That is, the convex structure in the concave-convex structure 41 of the organic layer 30 and the concave structure in the concave-convex structure of the inorganic layer 50 are arranged opposite to each other. In this way, the consistency of the thickness of the adhesive layer between the organic layer and the inorganic layer can be ensured, preventing the uneven thickness of the adhesive layer from leading to insufficient interfacial bonding force between the organic layer and the inorganic layer.

Specifically, the specific number of the concave-convex structure 41 can be set according to requirements. If a greater bonding force between the organic layer 30 and the inorganic layer 50 is to be achieved, more concave-convex structures 41 are provided. The concave-convex structure 41 can increase the contact area between the organic layer 30, the inorganic layer 50 and the adhesive layer 40, prevent mutual slippage between the film layers, and further enhance the bonding force of the film layer interface.

The cross-sectional shape of the concave-convex structure 41 may include regular shapes such as rectangular, square, triangular, trapezoidal circular arc, etc., or other irregular shapes. As shown in FIG. 5, the cross-sectional shape of the concave-convex structure 41 is a "convex" structure composed of two rectangles of different sizes, and the size of the upper part of the concave-convex structure 41 is larger than the size of the lower part thereof. Designing the concave-convex structure 41 into a "convex" shape can better prevent mutual slippage between the film layers, and better enhance the bonding force of the film layer interface. However, the present application is not limited to this, and the cross-sectional shape of the concave-convex structure 41 of the organic layer 30 may also be different from the cross-sectional shape of the concave-convex structure 41 of the adhesive layer 40.

It is understandable that the concave-convex structure 41 of the present application is not limited to be provided on both of the surfaces of the organic layer 30 and the inorganic layer 50 in contact with the adhesive layer 40. The concave-convex structure 41 of the present application may also be provided only on the surface of the organic layer 30 in contact with the adhesive layer 40 or the surface of the inorganic layer 50 in contact with the adhesive layer 40. In this way, the bonding force between the organic layer 30 and the inorganic layer 50 can also be increased. For other descriptions, please refer to the above-mentioned embodiment, which will not be repeated here.

Figure 6:
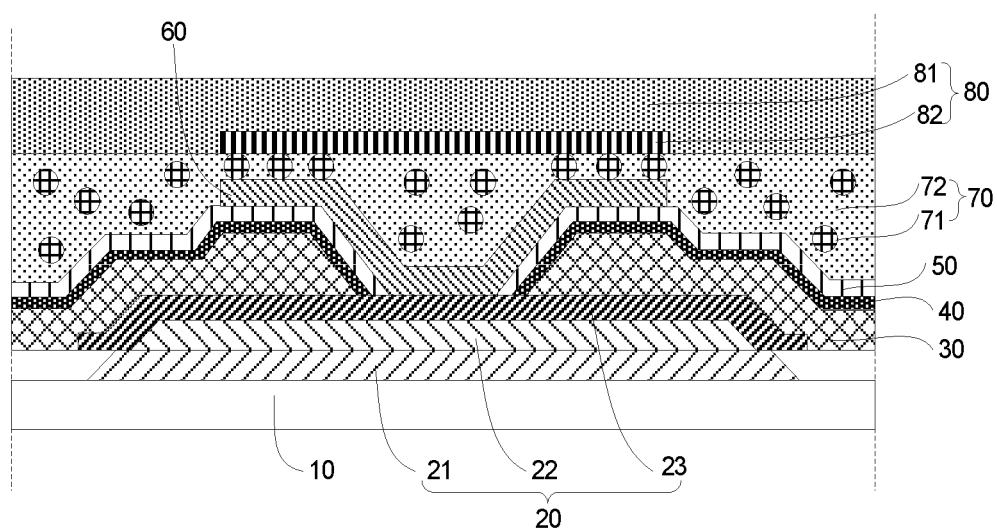
FIG. 6 is a schematic partial cross-sectional diagram of a display device provided by an embodiment of the application.

Please refer to FIG. 6. FIG. 6 is a schematic diagram of a partial cross-sectional structure of a display device according to an embodiment of the present application. The display device includes the display panel 100 described in one of the foregoing embodiments and a driving device 80 bonded to the bonding area BA of the display panel 100, where the driving device 80 includes a plurality of connecting terminals 82, and the connecting terminals 82 are electrically connected to the bonding terminals 60.

Specifically, the driving device 80 may be a flexible printed circuit, and the flexible printed circuit is electrically connected to the bonding terminal 60 of the bonding area BA. The bonding terminal 60 is connected to the signal line pattern 20 to provide driving electrical signals to the corresponding signal lines in the display panel 100. The driving device 80 is a flexible printed circuit, which may include a flexible printed circuit body 81, a connecting terminal 82 arranged on the flexible printed circuit body 81 and used to bond the terminal 60 to provide electrical connection, and a driver chip (integrated circuit, IC) (not shown) bonded on the flexible printed circuit body. The driving signal of the driving chip is transmitted to the corresponding signal line in the display panel 100 through the connecting terminal 82, the bonding terminal 60, and the signal line pattern 20.

Further, the electrical connection between the connecting terminal 82 and the bonding terminal 60 can be achieved by arranging a conductive adhesive 70 between the two. The conductive adhesive 70 includes a conductive adhesive film such as an anisotropic conductive film (ACF). The anisotropic conductive film has characteristics of unidirectional vertical conduction and lateral insulation. The conductive adhesive 70 shown in FIG. 6 includes an adhesive material 72 and conductive particles 71 distributed in the adhesive material 72. The conductive particles 71 in the adhesive material 72 can electrically connect the connecting terminal 82 and the bonding terminal 60.

It is understandable that the display device of the present application may also include a polarizer, a cover plate, and other supporting structures such as a backplate provided on a lower surface of the substrate, which is not repeated here.

In the display device of this embodiment, by providing an adhesive layer 40 formed of amorphous silicon with relatively large surface roughness between the organic layer 30 and the inorganic layer 50, the bonding force between the organic layer 30 and the inorganic layer 50 is enhanced. This solves the problem that the organic layer 30 and the inorganic layer 50 in the bonding area BA are peeled off after being bonded to the bonding pad caused by poor peeling of the flexible printed circuit, thereby greatly improving the yield of the display panel.

Figure 7:
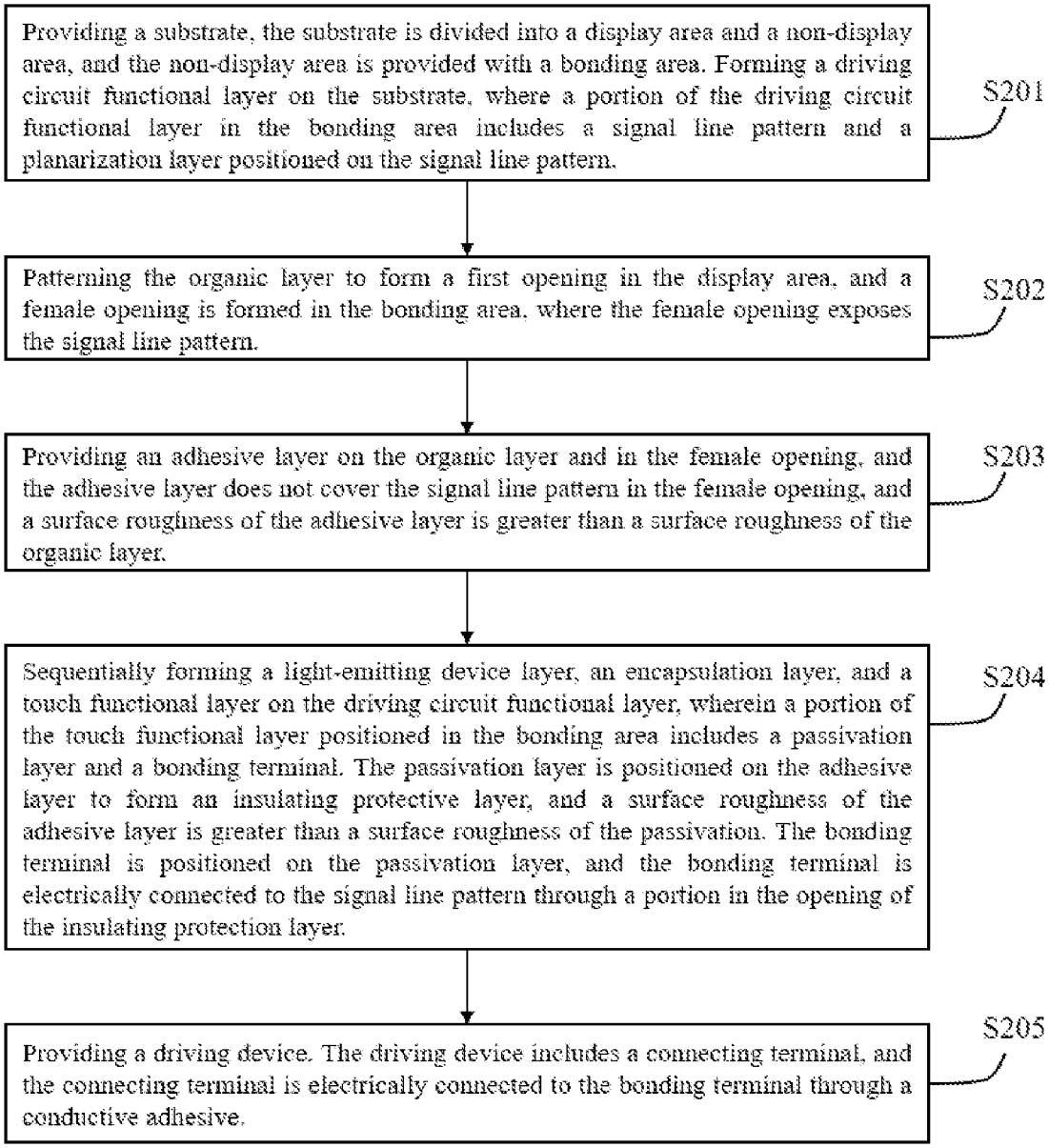
FIG. 7 is a schematic flowchart of a manufacturing method of the display device according to an embodiment of the application.

Please refer to FIG. 7 to FIG. 11, wherein FIG. 7 is a schematic flow chart of a manufacturing method of a display device according to an embodiment of the application. FIG. 8 to FIG. 11 are schematic diagrams of film layer structures obtained in each step of the manufacturing method of the display device provided by the embodiment of the application. The manufacturing method of the display device includes following steps:

S201: providing a substrate 10, where the substrate 10 is divided into a display area AA and a non-display area NA, and the non-display area NA is provided with a bonding area BA. Forming a driving circuit functional layer 1 on the substrate 10, where a portion of the driving circuit functional layer 1 in the bonding area BA includes a signal line pattern 20 and an organic layer 30 on the signal line pattern 20.

Figure 8:
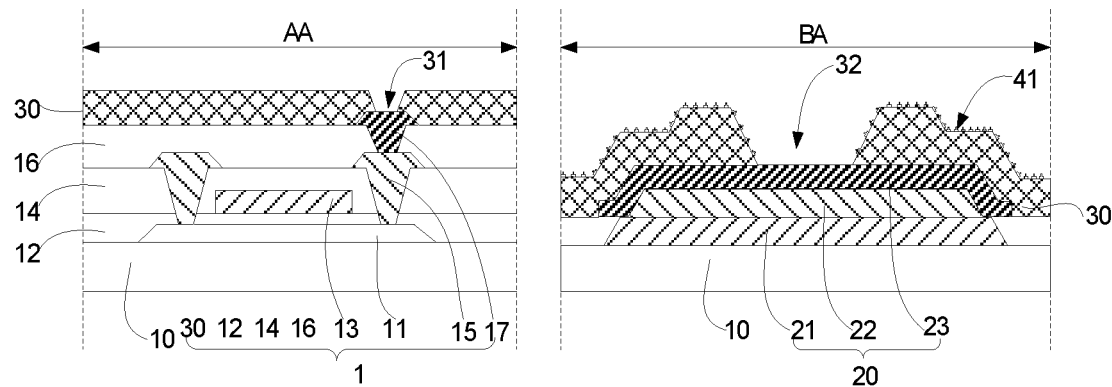
FIG. 8 to FIG. 11 are schematic diagrams of film layer structures obtained in each step of the manufacturing method of the display device provided by the embodiment of the application.

Specifically, please refer to FIG. 8. The substrate 10 includes polyimide, etc., and a driving circuit functional layer 1 is formed on the substrate 10. Generally, an inorganic buffer layer is deposited on the substrate 10 first to protect the devices formed on the substrate 10. The portion of the driving circuit functional layer 1 positioned in the display area AA includes an active layer 11, a gate insulating layer 12, a gate 13, a first interlayer insulating layer 14, a first source/drain layer 15, a second interlayer insulating layer 16, a second source/drain layer 17, an organic layer 30, a pixel electrode 26, and a pixel definition layer 27, which are sequentially stacked and deposited on the buffer layer. The portion of the driving circuit functional layer 1 positioned in the bonding area BA includes a signal line pattern 20 provided on a buffer layer and an organic layer 30 provided on the signal line pattern 20. The signal line pattern 20 includes a first metal pattern 21 provided on the same layer as the gate electrode 13, a second metal pattern 22 provided on the same layer as the first source/drain layer 15, and a third metal pattern 23 provided in the same layer as the second source/drain layer 17. The first metal pattern 21, the second metal pattern 22, and the third metal pattern 23 are in contact with each other.

S202, patterning the organic layer 30 to form a first opening 31 in the display area AA, and a female opening 32 is formed in the bonding area BA, where the female opening 32 exposes the signal line pattern 20.

Specifically, please continue to refer to FIG. 8. A first opening 31 is formed on the organic layer 30 of the display area AA through a lithography process, while a female opening 32 and a concave-convex structure 41 are formed on the organic layer 30 of the bonding area BA. The cross-sectional shape of the concave-convex structure 41 is a "convex" structure composed of two rectangles of different sizes, and the size of an upper part of the concave-convex structure 41 is larger than the size of a lower part thereof. The first opening 31 of the display area AA exposes a portion of the second source/drain layer 17, and the female opening 32 of the bonding area BA exposes the signal line pattern 20.

S203, providing an adhesive layer 40 on the organic layer 30 and in the female opening 32, and the adhesive layer 40 does not cover the signal line pattern 20 in the female opening 32. A surface roughness of the adhesive layer 40 is greater than a surface roughness of the organic layer 30.

Figure 9:
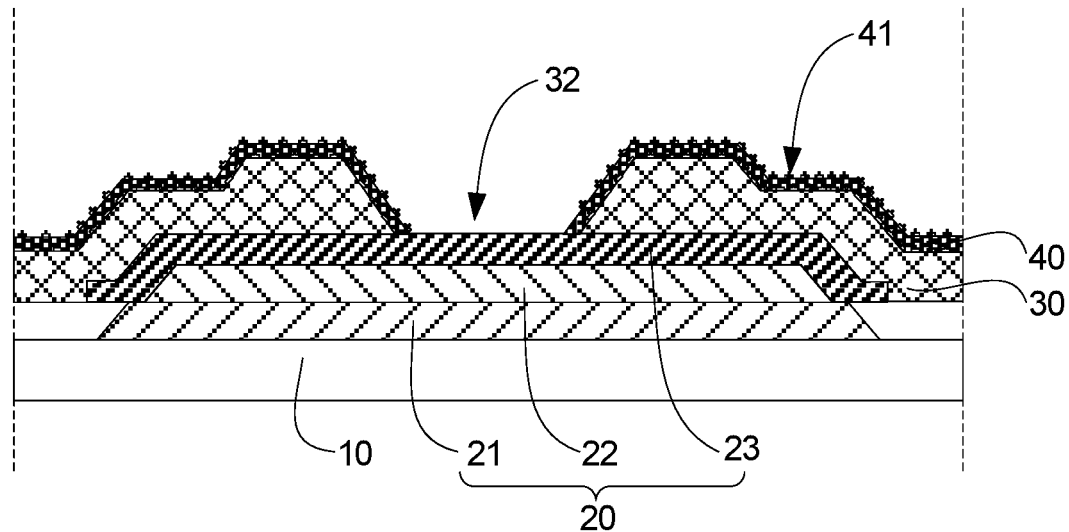

Specifically, please refer to FIG. 9. A material with relatively large surface roughness such as an amorphous silicon film is deposited on the organic layer 30 to form an adhesive layer 40. The adhesive layer 40 is patterned to remove the adhesive layer 40 at the bottom of the female opening 32 of the bonding area BA to expose the signal line pattern 20, while a concave-convex structure 41 is formed on the adhesive layer 40. The cross-sectional shape of the concave-convex structure 41 is a "convex" shaped structure composed of two rectangles of different sizes. The size of the upper part of the concave-convex structure 41 is larger than the size of the lower part thereof. It should be noted that the adhesive layer 40 may be formed only in the bonding area BA to increase the bonding force with the organic layer 30 in the bonding area BA.

S204, sequentially forming a light-emitting device layer 2, an encapsulation layer 3, and a touch functional layer 4 on the driving circuit functional layer 1, wherein a portion of the touch functional layer 4 positioned in the bonding area BA includes an inorganic layer 50 and a bonding terminal 60. The inorganic layer 50 is positioned on the adhesive layer 40 to form an insulating protective layer, and a surface roughness of the adhesive layer 40 is greater than a surface roughness of the inorganic layer 50. The bonding terminal 60 is positioned on the inorganic layer 50, and the bonding terminal 60 is electrically connected to the signal line pattern 20 through a portion in the opening of the insulating protection layer.

Figure 10:
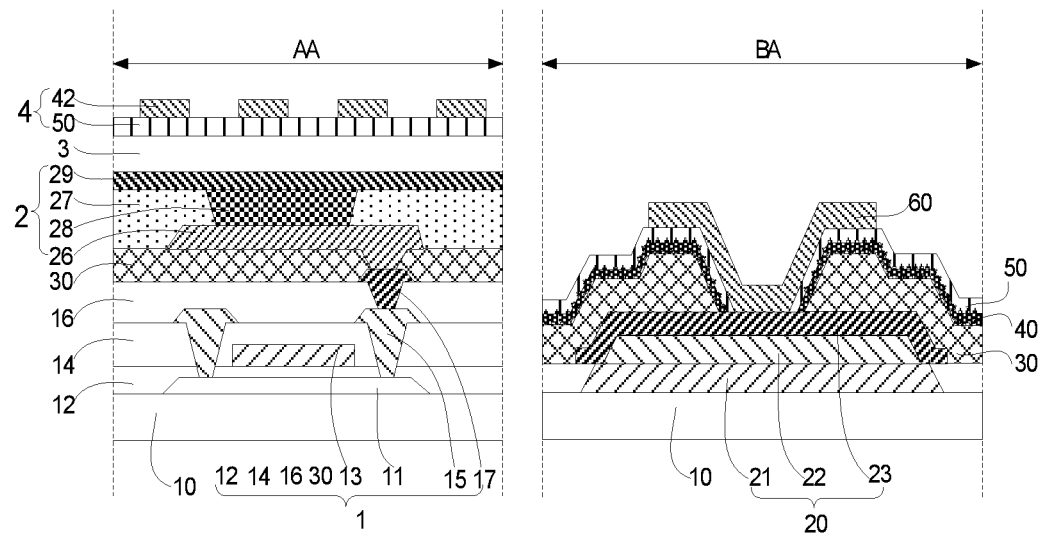

Specifically, please refer to FIG. 10. A light-emitting device layer 2, an encapsulation layer 3, and a touch function layer 4 are sequentially formed on the driving circuit functional layer 1. The portion of the light-emitting device layer 2 positioned in the display area AA includes a pixel electrode 26, a pixel definition layer 27, a luminescent material layer 28, and a cathode layer 29, and the light-emitting device layer 2 is not provided in the bonding area BA. The encapsulation layer 3 can be encapsulated by a thin film. The thin film encapsulation may be a laminated structure formed by sequentially stacking three layers of thin films of a first inorganic encapsulating layer, an organic encapsulating layer, and a second inorganic encapsulating layer or a laminated structure of more layers. The touch functional layer 4 adopts a DOT touch solution and is directly disposed on the encapsulation layer 3 to realize a touch function. The portion of the touch functional layer 4 positioned in the display area AA includes an inorganic layer 50 disposed on the encapsulation layer 3 and a touch electrode 42 disposed on the inorganic layer 50. The portion of the touch functional layer 4 positioned in the bonding area BA includes an inorganic layer 50 disposed on the adhesive layer 40 and a bonding terminal 60 disposed on the inorganic layer 50. The bonding terminal 60 and the touch electrode 42 are disposed in the same layer. The inorganic layer 50 covers the surface of the adhesive layer 40, but does not cover the signal line pattern 20 exposed at the bottom of the female opening. The inorganic layer 50, the adhesive layer 40, and the organic layer 30 together form the insulating protective layer. The bonding terminal 60 is positioned on the inorganic layer 50, and the bonding terminal 60 is electrically connected to the signal line pattern 20 through the portion in the opening of the insulating protection layer.

The inorganic layer 50 covers the adhesive layer 40. Because the surface roughness of the adhesive layer 40 is greater than the surface roughness of the inorganic layer, the interface bonding force between the adhesive layer 40 and the inorganic layer 50 can be increased, and thereby increasing the interface bonding force between the organic layer 30 and the inorganic layer 50. In addition, the adhesive layer 40 is also provided with a concave-convex structure, and because the inorganic layer 50 covers the adhesive layer 40, the surface of the inorganic layer 50 in contact with the adhesive layer 40 also has an undulating concave-convex shape. Furthermore, the concave-convex structure of the inorganic layer 50 and the concave-convex structure of the organic layer 30 are arranged alternately. In this way, the bonding force of the interface can be further enhanced, and the thickness consistency of the adhesive layer 40 between the organic layer 30 and the inorganic layer 50 can be ensured, while mutual slippage between the film layers can be prevented.

S205, providing a driving device 80. The driving device 80 includes a connecting terminal 82, and the connecting terminal 82 is electrically connected to the bonding terminal 60 through a conductive adhesive 70.

Figure 11:
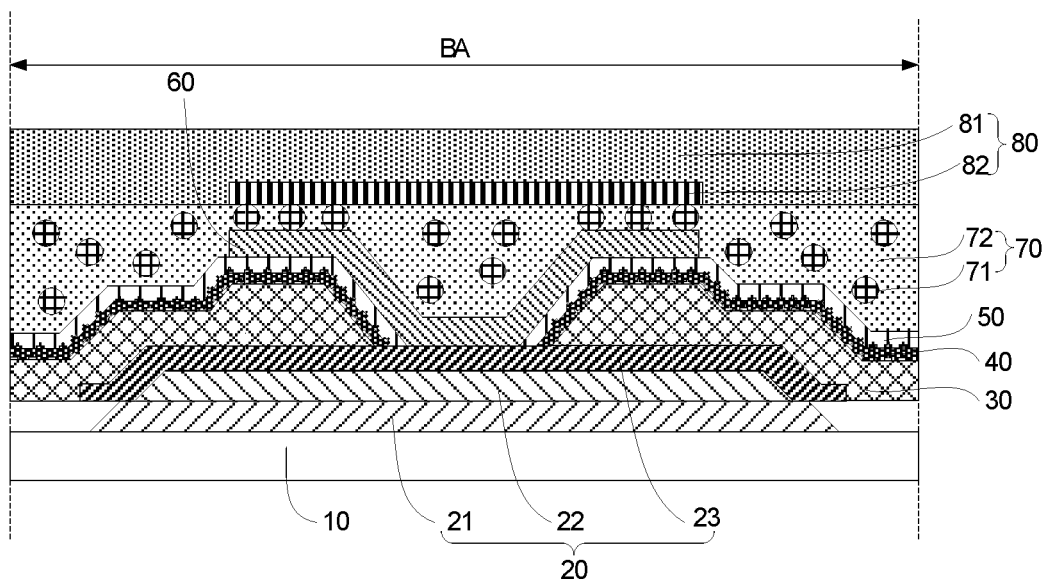

Specifically, please refer to FIG. 11. A conductive adhesive 70 is disposed on the bonding terminal 60 of the bonding area BA. The conductive adhesive 70 may be an anisotropic conductive film. The conductive adhesive 70 includes an adhesive material 72 and conductive particles 71 distributed in the adhesive material 72. A driving device 80 is provided, and the driving device 80 may be a flexible printed circuit, which includes a flexible printed circuit body 81, a connecting terminal 82 provided on the flexible printed circuit body 81 for electrical connection with the bonding terminal 60, and a driving chip bonded to the flexible printed circuit body 81. A hot-pressing process is used to bond the driving device 80 to the bonding area BA through the conductive adhesive 70 so that the connecting terminal 82 of the driving device 80 is electrically connected to the bonding terminal 60 of the bonding area BA through the conductive particles 71 of the conductive adhesive 70.

It is understandable that the manufacturing method of the display device of the present application may further include attaching a polarizer and a cover plate on the touch functional layer and attaching a support structure such as a backplate on the lower surface of the substrate, which will not be repeated here.

It should be noted that the manufacturing method of the display device of the present application takes as an example that the concave-convex structure is provided on the surface where the organic layer is in contact with the adhesive layer and the surface where the inorganic layer is in contact with the adhesive layer, but this application is not limited to this. The concave-convex structure 41 of the present application may also be provided only on the surface of the organic layer 30 in contact with the adhesive layer 40 or the surface of the inorganic layer 50 in contact with the adhesive layer 40. In addition, the manufacturing method of the display device of the present application can be used to manufacture any display device in the foregoing embodiments.

According to the above embodiment, it can be known that:

a display panel, a display device, and a manufacturing method thereof are provided. The display panel has a display area and a non-display area at one side of the display area. A bonding area is provided in the non-display area, and the display panel includes an organic layer, an inorganic layer, and an adhesive layer positioned between the organic layer and the inorganic layer in the bonding area. The surface roughness of the adhesive layer is greater than the surface roughness of the organic layer and the surface roughness of the inorganic layer so as to enhance the bonding force between the organic layer and the inorganic layer. In addition, concave-convex structures can be provided on a surface of the organic layer and/or the inorganic layer in contact with the adhesive layer to increase a contact area of an interface, while preventing mutual slippage between the film layers, further enhancing the bonding force of the interface. This solves a peeling-off problem of the organic layer and the inorganic layer in the bonding area, which causes the flexible printed circuit to fall off after it is bonded to the bonding pad. Therefore, the yield of the display panel is greatly improved.

As described above, although this application has been disclosed in preferred embodiments, the preferred embodiments are not intended to limit the application. Those of ordinary skill in the art can make various changes and modifications without departing from the spirit and scope of this application. Therefore, the protection scope of this application is subject to the scope defined by the claims.

What is claimed is:

1. A display panel, comprising a display area and a non-display area positioned at one side of the display area, wherein the non-display area comprises a bonding area, and the display panel in the bonding area further comprises:
   a substrate;
   a signal line pattern disposed on the substrate;
   an insulation protection layer disposed on the signal line pattern, wherein an opening is provided at a position corresponding to the signal line pattern, and the opening exposes at least part of the signal line pattern; and
   a bonding terminal disposed on the insulation protection layer and electrically connected to the signal line pattern through the at least part of the signal line pattern in the opening;
   wherein, the insulation protection layer comprises an adhesive layer and an organic layer and an inorganic layer disposed on opposite sides of the adhesive layer, and a surface roughness of the adhesive layer is greater than a surface roughness of the organic layer and a surface roughness of the inorganic layer; wherein a surface of the organic layer which is in contact with the adhesive layer is provided with a concave-convex structure, and a surface of the inorganic layer in contact with the adhesive layer is provided with a concave-convex structure;
   wherein an orthographic projection of each convex structure of the concave-convex structure of the organic layer on the substrate is partially outside and partially overlapped with an orthographic projection of a corresponding concave structure of the concave-convex structure of the inorganic layer on the substrate; or
   an orthographic projection of each concave structure of the concave-convex structure of the organic layer on the substrate is partially outside and partially overlapped with an orthographic projection of a corresponding convex structure of the concave-convex structure of the inorganic layer on the substrate.

2. The display panel according to claim 1, wherein the concave-convex structures of the organic layer and the concave-convex structures of the inorganic layer are alternately arranged.

3. The display panel according to claim 1, wherein a cross-sectional shape of the concave-convex structures comprises at least one of rectangular, square, triangular, trapezoidal, arc, or a convex shape.

4. The display panel according to claim 1, wherein the organic layer is disposed on a side of the adhesive layer facing the signal line pattern, and the inorganic layer is disposed on a side of the adhesive layer away from the signal line pattern.

5. The display panel according to claim 1, wherein a thickness of the adhesive layer is less than a thickness of the organic layer and a thickness of the inorganic layer.

6. The display panel according to claim 1, wherein a material of the adhesive layer comprises amorphous silicon.

7. The display panel according to claim 1, further comprising a driving circuit functional layer disposed on the substrate, wherein the driving circuit functional layer comprises an active layer, a gate insulating layer, a gate, a first interlayer insulating layer, a first source/drain layer, a second interlayer insulating layer, and a second source/drain layer stacked in the display area.

8. The display panel according to claim 7, wherein the signal line pattern comprises a first metal pattern provided in a same first layer as the gate, a second metal pattern provided in a same second layer as the first source/drain layer, and a third metal pattern provided in a same third layer as the second source/drain layer, and the first metal pattern, the second metal pattern, and the third metal pattern are in contact with each other.

9. The display panel according to claim 1, wherein a cross-sectional shape of the opening of the insulation protection layer comprises inverted trapezoidal.

10. A display device, comprising a display panel and a driving device, wherein the display panel comprises a display area and a non-display area positioned at one side of the display area, the non-display area comprises a bonding area, and the display panel in the bonding area further comprises:
    a substrate;
    a signal line pattern disposed on the substrate;
    an insulation protection layer disposed on the signal line pattern, wherein an opening is provided at a position corresponding to the signal line pattern, and the opening exposes at least part of the signal line pattern; and
    a bonding terminal disposed on the insulation protection layer and electrically connected to the signal line pattern through the at least part of the signal line pattern in the opening;

wherein, the insulation protection layer comprises an adhesive layer and an organic layer and an inorganic layer disposed on opposite sides of the adhesive layer, and a surface roughness of the adhesive layer is greater than a surface roughness of the organic layer and a surface roughness of the inorganic layer; and the driving device comprises a plurality of connecting terminals, and at least one of the connecting terminals is electrically connected to the bonding terminal;

wherein a surface of the organic layer which is in contact with the adhesive layer is provided with a concave-convex structure, and a surface of the inorganic layer in contact with the adhesive layer is provided with a concave-convex structure;

wherein an orthographic projection of each convex structure of the concave-convex structure of the organic layer on the substrate is partially outside and partially overlapped with an orthographic projection of a corresponding concave structure of the concave-convex structure of the inorganic layer on the substrate; or an orthographic projection of each concave structure of the concave-convex structure of the organic layer on the substrate is partially outside and partially overlapped with an orthographic projection of a corresponding convex structure of the concave-convex structure of the inorganic layer on the substrate.

11. The display device according to claim 10, wherein the concave-convex structures of the organic layer and the concave-convex structures of the inorganic layer are alternately arranged.

12. The display device according to claim 10, wherein the organic layer is disposed on a side of the adhesive layer facing the signal line pattern, and the inorganic layer is disposed on a side of the adhesive layer away from the signal line pattern.

13. The display device according to claim 10, wherein a thickness of the adhesive layer is less than a thickness of the organic layer and a thickness of the inorganic layer.

14. The display device according to claim 10, wherein a material of the adhesive layer comprises amorphous silicon.

15. The display device according to claim 10, comprising a conductive adhesive, and the connecting terminals are electrically connected to the bonding terminal through the conductive adhesive.

16. The display device according to claim 15, wherein the conductive adhesive comprises an anisotropic conductive film.

* * * * *